(12) United States Patent
Ko et al.

(10) Patent No.: US 7,714,758 B2
(45) Date of Patent: May 11, 2010

(54) DIGITAL-TO-ANALOG CONVERTER AND METHOD THEREOF

(75) Inventors: Ju Hyun Ko, Yongin-si (KR); Ji Woon Jung, Gwangmyeong-si (KR); Jong Seon Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 42 days.

(21) Appl. No.: 12/153,696

(22) Filed: May 22, 2008

(65) Prior Publication Data

US 2008/0297390 A1    Dec. 4, 2008

(30) Foreign Application Priority Data

May 30, 2007    (KR) ..................... 10-2007-0052798
Feb. 25, 2008    (KR) ..................... 10-2008-0016598

(51) Int. Cl.
    *H03M 1/66* (2006.01)
(52) U.S. Cl. ...................... 341/144; 341/145
(58) Field of Classification Search ................ 341/144, 341/145, 118, 150, 154, 122
    See application file for complete search history.

(56) References Cited

U.S. PATENT DOCUMENTS

| | | | | |
|---|---|---|---|---|
| 5,426,431 A * | 6/1995 | Ryu | ................. | 341/158 |
| 6,950,045 B2 * | 9/2005 | Kim | ................. | 341/118 |
| 7,355,543 B2 * | 4/2008 | Kwon-Chang et al. | ...... | 341/150 |

FOREIGN PATENT DOCUMENTS

| | | |
|---|---|---|
| JP | 09-218671 | 8/1997 |
| JP | 11-296143 | 10/1999 |
| JP | 11-296147 | 10/1999 |
| KR | 10-2000-0058111 | 9/2000 |
| KR | 10-2002-0057802 | 7/2002 |

* cited by examiner

*Primary Examiner*—Jean B Jeanglaude
*Assistant Examiner*—Joseph Lauture
(74) *Attorney, Agent, or Firm*—Harness, Dickey & Pierce

(57) ABSTRACT

An integrated circuit may include an operation amplifier, a first capacitor, a plurality of second capacitors, and/or a switching circuit. The operational amplifier may have a first input terminal, a second input terminal, and/or an output terminal. The first capacitor may have a first terminal and a second terminal. The second terminal of the first capacitor may be connected to the first input terminal of the operational amplifier. The plurality of second capacitors may each have a first terminal and a second terminal. The second terminal of each of the second capacitors may be connected to the second input terminal of the operational amplifier. The switching circuit may include a plurality of switches configured to switch in response to a plurality of switching signals. The switching circuit may be configured to transmit a reference voltage to the first terminal of the first capacitor and the first terminals of the second capacitors and/or connect the first input terminal of the operational amplifier to the output terminal of the operational amplifier during a first period. The switching circuit may be configured to isolate the first terminal of the first capacitor from the reference voltage, transmit a voltage selected from at least two selection voltages to the first terminals of the second capacitors, and/or connect the first terminal of the first capacitor to the output terminal of the operational amplifier during a second period.

23 Claims, 11 Drawing Sheets

DIGITAL-TO-ANALOG CONVERTER AND METHOD THEREOF

PRIORITY STATEMENT

This application claims the benefit of priority to Korean Patent Application Nos. 10-2007-0052798, filed on May 30, 2007 and 10-2008-0016598, filed on Feb. 25, 2008, in the Korean Intellectual Property Office, the entire contents of which are incorporated herein in their entirety by reference.

BACKGROUND

1. Field

Example embodiments relate to a digital-to-analog converter (DAC), and for example, to a DAC of a source driver circuit driving a liquid crystal display (LCD) device.

2. Description of Related Art

A digital-to-analog converter (DAC) is a core block of a source driver circuit driving a liquid crystal display (LCD) device. A resistor-based DAC (R-DAC) is typically used in the source driver circuit.

FIG. 1 illustrates a conventional R-DAC 100. The R-DAC 100 includes a resistor array 110, a decoder 120, and an operational amplifier (OP AMP) 130. The resistor array 110 includes a plurality of resistors 1st R through $2^n$th R connected in series between a first node receiving a first reference voltage Vref1 and a second node receiving a second reference voltage Vref2 (where Vref2<Vref1) to generate a plurality of voltages. The decoder 120 selects one voltage from the plurality of voltages in response to a digital signal for displaying full gray scale and outputs the selected voltage as a selection voltage DECO. For example, the decoder 120 selects one voltage line from a plurality of voltage lines $1^{st}$ line through $2^n$th line (e.g., metals) corresponding to the plurality of resistors 1st R through $2^n$th R.

An 8-bit DAC converting 8-bit digital data into an analog signal requires $2^8$ (i.e., 256) resistors and voltage lines. The decoder 120 is implemented by a 256-to-1 decoder selecting one from 256 voltages.

As the number of bits in the digital data increases, the number of resistors and voltage lines increases by geometric progression. For example, if the digital data is 10 bits, 1024 (i.e., $2^{10}$) resistors and voltage lines and a 1024-to-1 decoder are required. Accordingly, the size of a DAC increases.

In order to reduce the size of a DAC, a sample and hold circuit using a switched capacitor has been suggested as a DAC. DACs using the switched capacitor may be divided into linear DACs and nonlinear DACs. Because linear DACs have linear output characteristics, properly representing a gamma curve of LCD panels is more difficult. Accordingly, nonlinear DACs are more suitable for representing the gamma curve of LCD panels.

In order to implement switched capacitor DACs, two reference voltages may be divided into a plurality of gray scale voltages, or voltages applied to capacitors may be converted based on a reference voltage and the converted voltages may be output. However, conventional switched capacitor DACs occupy a larger area due to a more complicated structure of capacitors and switches, and/or the conventional switched capacitor DACs degrade picture quality due to an interchannel offset caused by an offset of a reference voltage.

SUMMARY

Example embodiments provide a digital-to-analog converter (DAC) occupying a smaller area, reducing an interchannel offset, and/or providing nonlinear output characteristics approximating a gamma curve of a liquid crystal display (LCD) panel, and/or a source driver and display device including the same.

According to an example embodiment, an integrated circuit may include an operational amplifier, a first capacitor, a plurality of second capacitors, and/or a switching circuit. The operational amplifier may have a first input terminal, a second input terminal, and/or an output terminal. The first capacitor may have a first terminal and a second terminal. The second terminal of the first capacitor may be connected to the first input terminal of the operational amplifier. The plurality of second capacitors may each have a first terminal and a second terminal. The second terminal of each of the second capacitors may be connected to the second input terminal of the operational amplifier. The switching circuit may include a plurality of switches configured to switch in response to a plurality of switching signals. The switching circuit may be configured to transmit a reference voltage to the first terminal of the first capacitor and the first terminals of the second capacitors and/or connect the first input terminal of the operational amplifier to the output terminal of the operational amplifier during a first period. The switching circuit may be configured to isolate the first terminal of the first capacitor from the reference voltage, transmit a voltage selected from at least two selection voltages to the first terminals of the second capacitors, and/or connect the first terminal of the first capacitor to the output terminal of the operational amplifier during a second period.

According to an example embodiment, the integrated circuit may include a voltage divider and/or a selection circuit. The voltage divider may include a resistor array connected between a first node receiving a first reference voltage and a second node receiving a second reference voltage. The voltage divider may be configured to generate a plurality of divided voltages by dividing a range between the second reference voltage and the first reference voltage. The selection circuit may be configured to select at least two voltages from the plurality of divided voltages in response to a first digital signal and provide the selected voltages as the at least two selection voltage. The first input terminal of the operational amplifier may be an inverting input terminal and the second input terminal of the operational amplifier may be a non-inverting input terminal. The first digital signal may be a portion of an n-bit digital signal.

According to an example embodiment, the reference voltage may be one of the first reference voltage, the second reference voltage, a medium voltage between the first reference voltage and the second reference voltage, and/or one among the at least two selection voltages.

According to an example embodiment, the at least two selection voltages may include a first selection voltage and a second selection voltage lower than the first selection voltage. The switching circuit may include a first switch connected between the first input terminal of the operational amplifier and the output terminal of the operational amplifier; a second switch configured to selectively transmit the reference voltage to the first terminal of the first capacitor; a third switch configured to selectively connect the first terminal of the first capacitor to the output terminal of the operational amplifier; and/or a plurality of second group switches configured to selectively transmit the reference voltage, the first selection voltage, and the second selection voltage to the plurality of the second capacitors.

According to an example embodiment, the selection circuit may include at least two decoders. Each of the decoders may be configured to receive a portion of the divided voltages and to select one from the received divided voltages in response to a first signal in the first digital signal. The first and second selection voltages may be selected from output signals of the at least two decoders.

According to another example embodiment, a digital-to-analog conversion method may include during a first period, providing a reference voltage to a first capacitor connected to a first input terminal of an operational amplifier and a plurality of second capacitors connected to a second input terminal of the operational amplifier and connecting the first input terminal of the operational amplifier to an output terminal of the operational amplifier. The method may include, during a second period, isolating the first capacitor from the reference voltage, transmitting a voltage selected from at least two selection voltages to each of the plurality of second capacitors, and connecting a first terminal of the first capacitor to the output terminal of the operational amplifier.

According to an example embodiment, the at least two selection voltages may be determined based on a first digital signal, and the voltage transmitted to each of the plurality of second capacitors during the second period may be determined based on a second digital signal.

According to an example embodiment, the first digital signal may be comprised of at least one upper bit of a digital signal and the second digital signal may be comprised of at least one lower bit of the digital signal.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
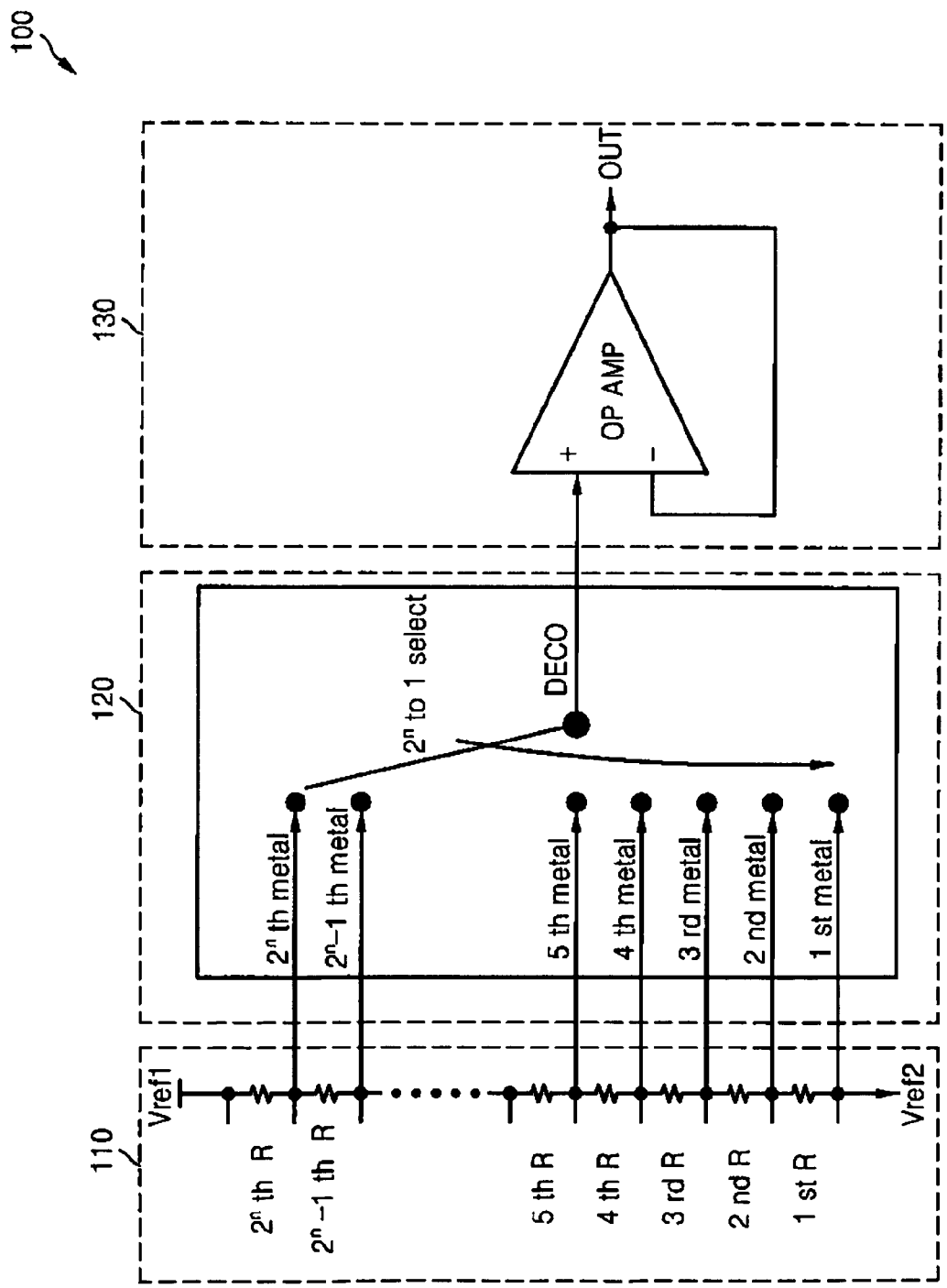
FIG. 1 illustrates a conventional digital-to-analog converter (DAC)

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 2:
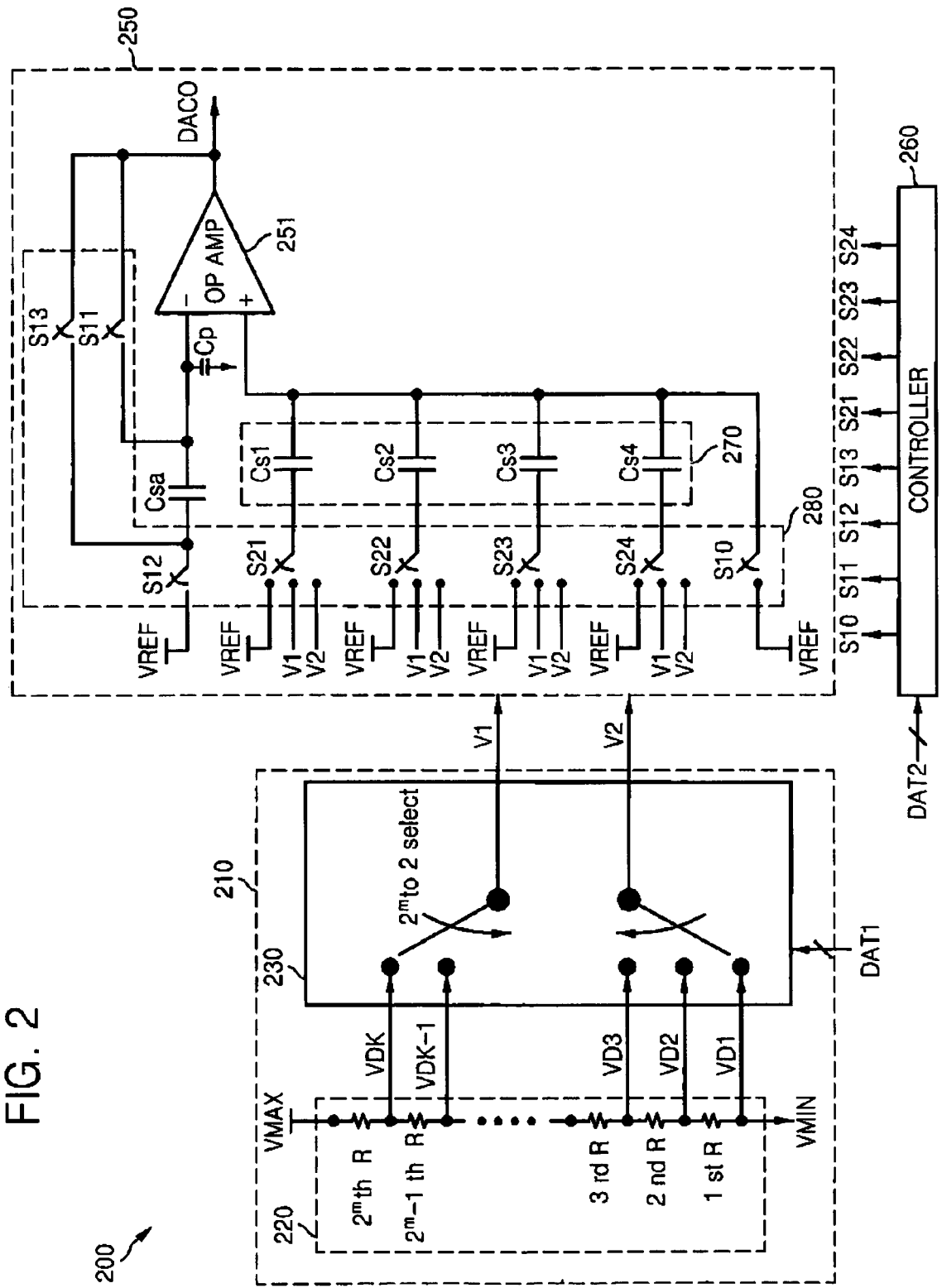
FIG. 2 illustrates a DAC according to an example embodiment.
Figure 4:
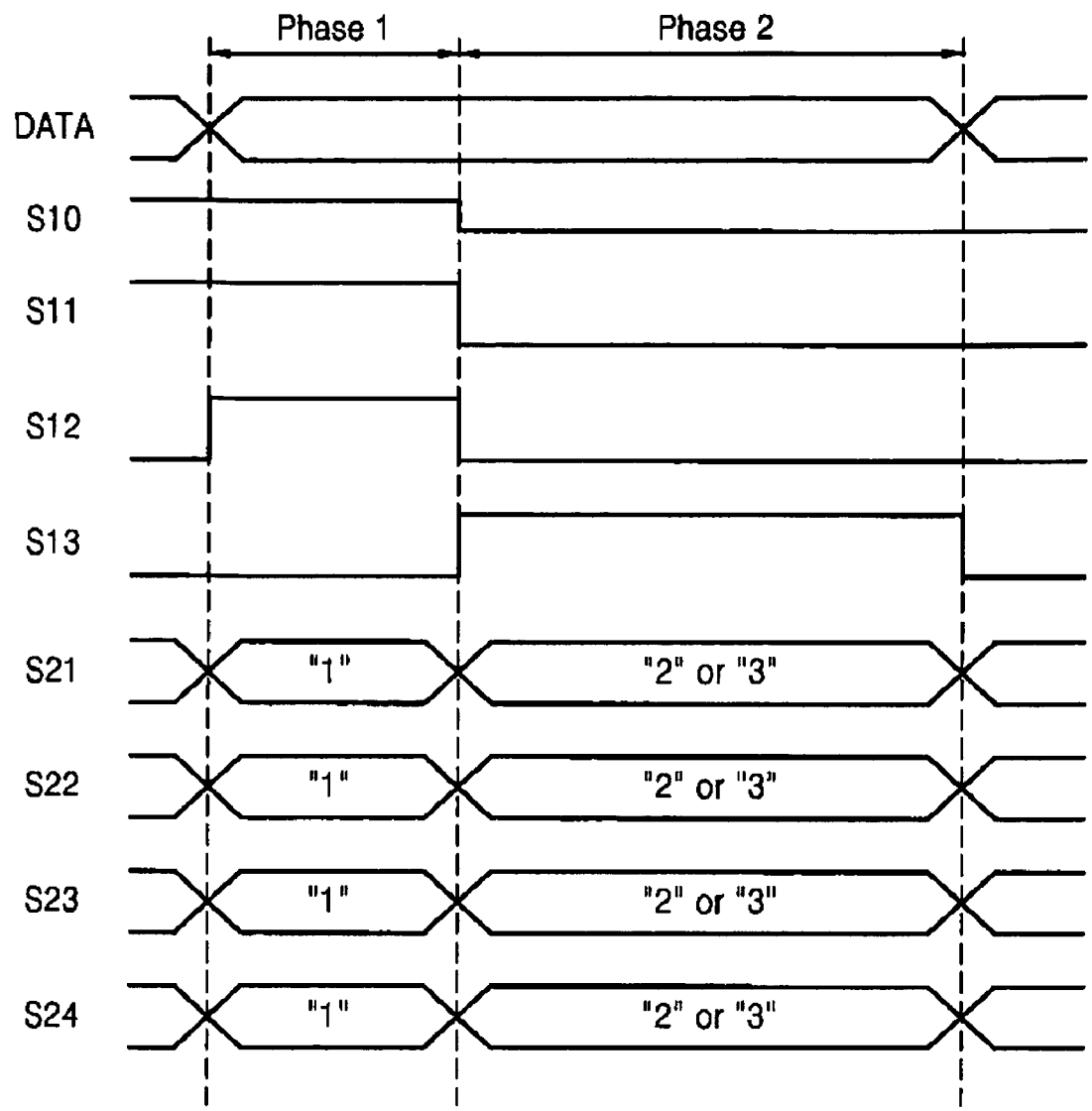
FIG. 4 is an example timing chart of a digital signal and a plurality of switching signals according to an example embodiment.

FIG. 2 illustrates a digital-to-analog converter (DAC) 200 according to an example embodiment. FIG. 4 is an example timing chart of a digital signal DATA and a plurality of switching signals according to an example embodiment.

Referring to FIGS. 2 and 4, the DAC 200, which may be implemented in an integrated circuit, may include an amplifier (which may be referred to as a switched capacitor amplifier) 250. The amplifier 250 may include a first capacitor Csa, a second capacitor group 270, an operational amplifier (OP AMP) 251, and/or a switching circuit 280. The DAC 200 may be referred to as a resistor-capacitor DAC (RC-DAC).

The OP AMP 251 may include a first input terminal (e.g., an inverting (−) input terminal), a second input terminal (e.g., a non-inverting (+) input terminal), and an output terminal outputting an output signal DACO. The first capacitor Csa may include a first terminal and a second terminal connected with the first (−) input terminal of the OP AMP 251. The second capacitor group 270 may include a plurality of second capacitors (e.g., four second capacitors) Cs1, Cs2, Cs3, and Cs4, which may be connected with the second (+) input terminal of the OP AMP 251. For example, each of the second capacitors Cs1, Cs2, Cs3, and Cs4 may have a first terminal and a second terminal, and the second terminal of each of the second capacitors Cs1, Cs2, Cs3, and Cs4 may be connected with the second (+) input terminal of the OP AMP 251. The first capacitor Csa may have capacitance equal to the sum of capacitances of the second capacitors Cs1, Cs2, Cs3, and Cs4.

The switching circuit 280 may include first group switches, each of which switches in response to a corresponding signal among first group switching signals S11, S12, and S13, and second group switches, each of which switches in response to a corresponding signal among second group switching signals S21, S22, S23, and S24. The switching circuit 280 may further include an initializing switch operating in response to a switching signal S10 to initialize the second (+) input terminal of the OP AMP 251.

The first and second group switches included in the switching circuit 280 may be transistors. For example, a first switch operating in response to the switching signal S11 may be connected between the first (−) input terminal of the OP AMP 251 and the output terminal of the OP AMP 251. A second switch operating in response to the switching signal S12 may selectively transmit a reference voltage VREF (e.g., a first reference voltage VMIN) to the first terminal of the first capacitor Csa and/or may be connected between the first terminal of the first capacitor Csa and a node receiving the reference voltage VREF (e.g., the first reference voltage VMIN). A third switch may selectively connect the first terminal of the first capacitor Csa to the output terminal of the OP AMP 251 in response to the switching signal S13.

Each of the second group switches may selectively transmit one among the reference voltage VREF (e.g., the first reference voltage VMIN), a first selection voltage V1, and a second selection voltage V2 to the first terminal of a corresponding second capacitor Cs1, Cs2, Cs3, or Cs4. For example, a fourth switch may transmit the reference voltage VREF to the corresponding capacitor Cs1 for a first period and transmit the first or second selection voltage V1 or V2 to the corresponding capacitor Cs1 during a second period in response to the switching signal S21. Similarly, the fourth switch, fifth, sixth and seventh switches may transmit the reference voltage VREF to the corresponding capacitors Cs2, Cs3, and Cs4, respectively, for the first period and transmit the first or second selection voltage V1 or V2 to the corresponding capacitors Cs2, Cs3, and Cs4, respectively, during the second period in response to the switching signals S22, S23, and S24, respectively.

The reference voltage VREF may be the first reference voltage VMIN, but is not restricted thereto. For example, the reference voltage VREF may be a second reference voltage VMAX or a medium voltage between the first reference voltage VMIN and the second reference voltage VMAX, or the reference voltage VREF may be set to other values. If a DAC according to an example embodiment is used in a display device, the reference voltage VREF may vary with channels (or data lines).

The initializing switch may transmit the reference voltage VREF to the second (+) input terminal of the OP AMP 251 during the first period and/or during the initialization before the first period in response to the switching signal S10.

A parasitic capacitor Cp may be between the first (−) input terminal of the OP AMP 251 and a ground. Another capacitor may be connected to the first (−) input terminal and/or the second (+) input terminal of the OP AMP 251 for a symmetric parasitic capacitance between the input terminals of the OP AMP 251.

The DAC 200 may include a controller 260 to generate the switching signals S10, S11, S12, S13, S21, S22, S23, and S24. Timing of the switching signals S10, S11, S12, S13, S21, S22, S23, and S24 will be described later with reference to FIG. 4.

The DAC 200 may include a signal conversion block 210. The signal conversion block 210 may include a voltage divider 220 and/or a selection circuit 230.

The voltage divider 220 may be a resistor array including a plurality of resistors 1st R through $2^m$th R connected in series. For example, the voltage divider 220 may be a resistor array connected between a first node receiving the first reference voltage VMIN and a second node receiving the second reference voltage VMAX (where VMAX>VMIN) to generate divided voltages VD1 through VDK having different levels (e.g., K=$1^m$ or K=$2^m+1$). The resistance value of each of the resistors 1st R through $2^m$th R included in the voltage divider 220 may be determined by a desired, or alternatively, a predetermined gamma curve. In example embodiments, "m" is an integer less than the number "n" of bits in the digital signal DATA.

The selection circuit 230 may select at least two voltages from the plurality of divided voltages VD1 through VDK in response to a first digital signal DAT1 and provide the selected voltages as the at least two selection voltages V1 and V2. The selection voltages may be two-level voltages and are referred to as the first selection voltage V1 and the second selection voltage V2, as described above, and V2<V1.

The first digital signal DAT1 may be a signal composed of upper bits (e.g., upper "m" (<n) bits of the digital signal DATA. The digital signal DATA may be an n-bit parallel video signal (where "n" is a natural number, e.g., 10 or 12) and may be composed of the m-bit first digital signal DAT1 and an (n−m)-bit second digital signal DAT2.

The controller 260 may generate the second group switching signals S21, S22, S23, and S24 based on the (n−m)-bit second digital signal DAT2 composed of the lower bits of the digital signal DATA. This operation will be described in more detail later.

Figure 3A:
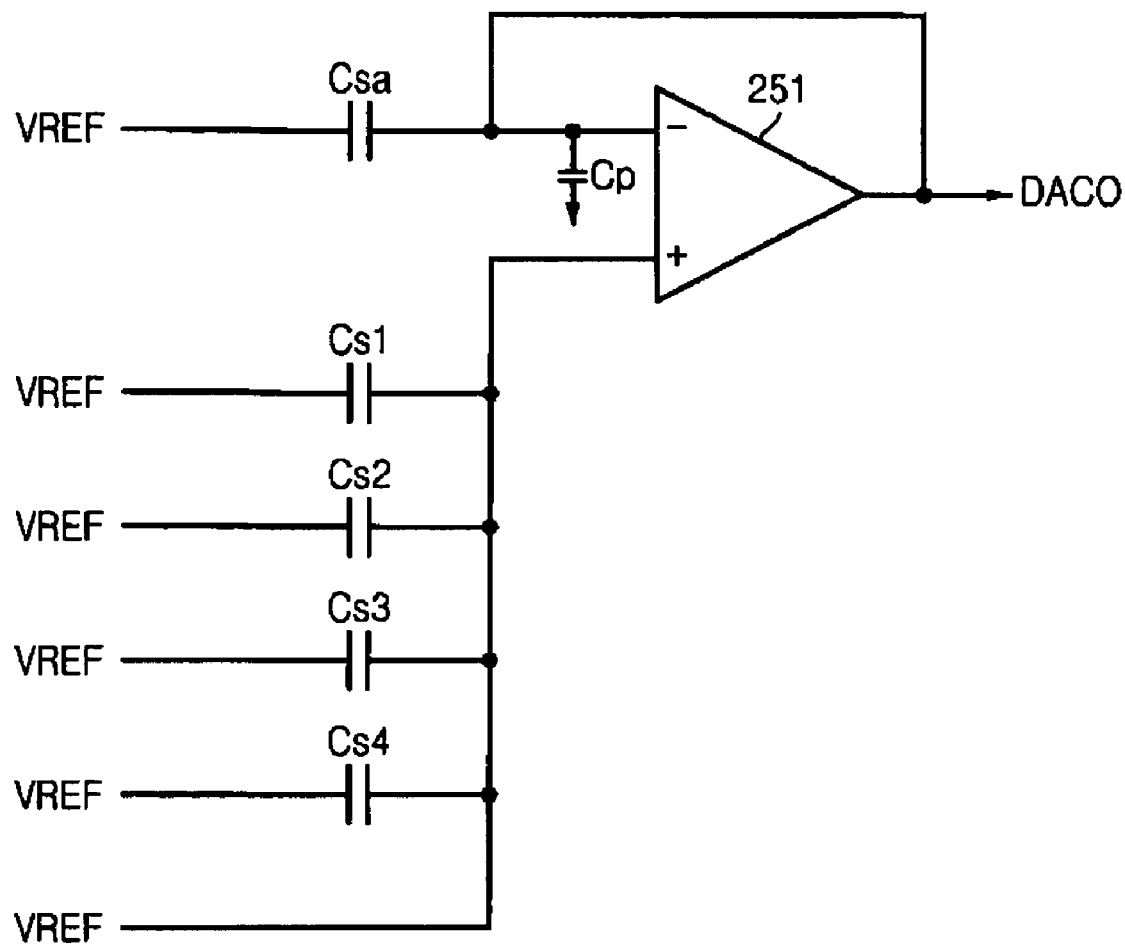
FIG. 3A illustrates a structure of the DAC during a first period according to an example embodiment.
Figure 3B:
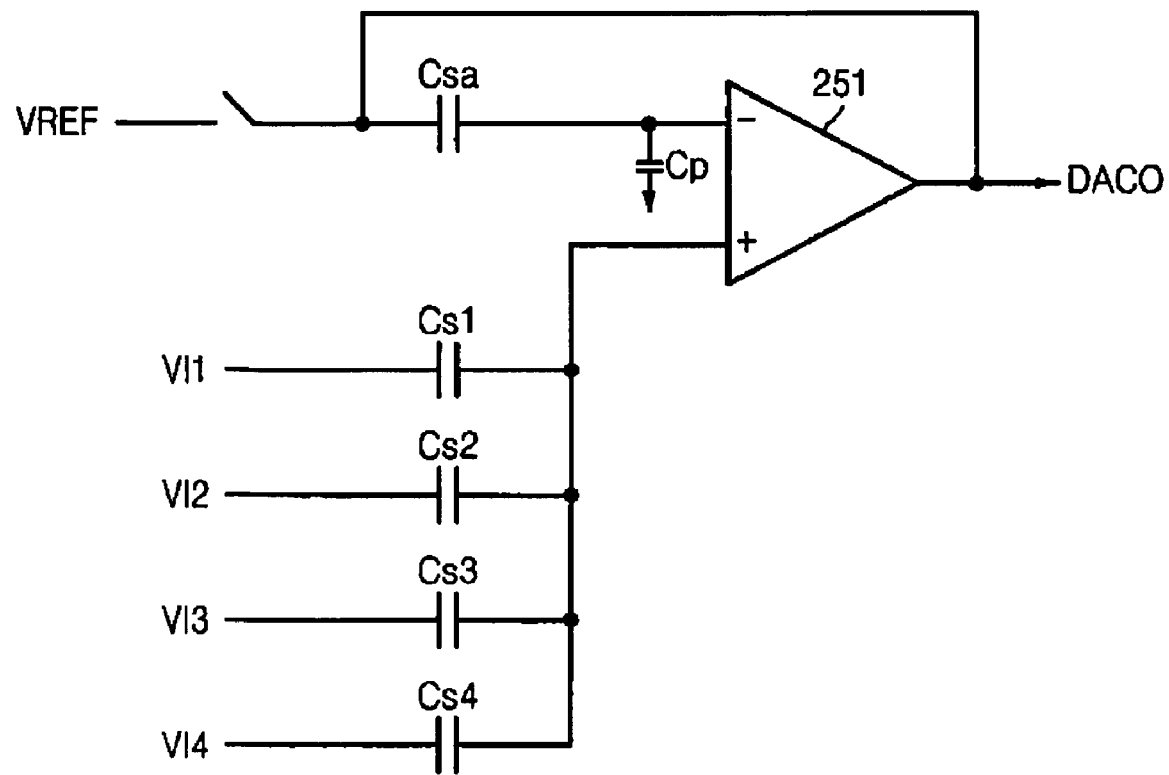
FIG. 3B illustrates a structure of the DAC during a second period according to an example embodiment.

FIGS. 3A and 3B illustrate a structure of the DAC 200 during the first period and a structure of the DAC 200 during the second period, respectively, according to example embodiments. Operation of the DAC 200 during the first and second periods will be described with reference to FIGS. 2 through 4 below.

During the first period Phase1, the switching circuit 280 may transmit the reference voltage VREF to the first terminal of the first capacitor Csa and the first terminals of the second capacitors Cs1 through Cs4, transmit the reference voltage VREF to the second (+) input terminal of the OP AMP 251, and/or connect the first (−) input terminal of the OP AMP 251 to the output terminal of the OP AMP 251. During the first period Phase1, the switching signals S10, S11, and S12 may be activated (e.g., to a "high level"). In response to the activated switching signals S10, S11, and S12, the initializing switch and the first and second switches may be closed. The switching signal S13 may be deactivated (e.g., to a "low level") and the third switch may be opened. The second group switching signals S21, S22, S23, and S24 may be in a first state (e.g., "1") and the second group switches responding to the signals S21 through S24 may transmit the reference voltage VREF to the second capacitors Cs1 through Cs4, respectively.

Accordingly, during the first period Phase1, the voltage of the second (+) input terminal of the OP AMP 251 may be equal to the reference voltage VREF and if an offset voltage Voff between the first (−) input terminal and the second (+) input terminal of the OP AMP 251 is ignored or assumed to be "0", the voltage of the second (+) input terminal of the OP AMP 251 and the output signal DAC0 may be equal to the reference voltage VREF.

During the second period Phase2, the switching circuit 280 may isolate the first terminal of the first capacitor Csa from the reference voltage VREF, transmit the first or second selection voltage V1 or V2 to the first terminals of the second capacitors Cs1 through Cs4, and/or connect the first terminal of the first capacitor Csa to the output terminal of the OP AMP 251. The switching signals S10, S11, and S12 may be deactivated (e.g., to a "low level") and the initializing switch and the first and second switches may be opened in response to the deactivated switching signals S10, S11, and S12 while the switching signal S13 is activated (e.g., to a "high level") and the third switch is closed. The second group switching signals S21, S22, S23, and S24 may be in a second or third state (e.g., "2" or "3") and the second group switches responding to the signals S21 through S24 may transmit the first or second selection voltage V1 or V2 to the corresponding second capacitors Cs1 through Cs4, respectively. The second group switches may transmit the first selection voltage V1 if the second group switching signals S21 through S24 are in the second state (e.g., "2") and may transmit the second voltage V2 if the second group switching signals S21 through S24 are in the third state (e.g., "3").

Only first and second periods are illustrated in FIG. 4, but another operation period, e.g., a pre-initialization period, may be provided. For example, during a pre-initialization period before the first period, the initializing switch responding to the signal S10 and the first switch responding to the signal S11 may be closed and initialization may be performed. The switching signals S1 through S13 and the switching signals S21 through S24 may not be synchronized in order to reduce switching noise.

For clarity of description, the second capacitors are referred to as first, second, third and fourth interpolation capacitors Cs1, Cs2, Cs3, and Cs4 and voltages applied to the first through fourth interpolation capacitors Cs1 through Cs4 during the second period are referred to as first, second, third and fourth input voltages VI1, VI2, VI3, and VI4. Each of the first through fourth input voltages VI1 through VI4 may be set to the first or second selection signal V1 or V2 according to the second group switching signals S21 through S24.

Accordingly, during the second period Phase2, Equation (1) is satisfied:

$$0 = Cs1(Vx - VI1) + Cs2(Vx - VI2) + Cs3(Vx - VI3) + Cs4(Vx - VI4), \quad (1)$$

where Vx is the voltage of the second (+) input terminal of the OP AMP 251. If the capacitance of the first (−) input terminal of the OP AMP 251 is substantially the same as that of the second (+) input terminal of the OP AMP 251, the voltage Vx becomes the voltage of the second (+) input terminal of the OP AMP 251 and the output signal DAC0 of the OP AMP 251 during the second period.

Based on Equation (1), the voltage Vx may be expressed by Equation (2):

$$Vx = \frac{Cs1 \cdot VI1 + Cs2 \cdot VI2 + Cs3 \cdot VI3 + Cs4 \cdot VI4}{(Cs1 + Cs2 + Cs3 + Cs4)}. \quad (2)$$

If the first through fourth interpolation capacitors Cs1 through Cs4 have the same capacitance, the output signal DAC0 of the OP AMP 251 may be determined according to the first through fourth input voltages VI1 through VI4 as shown in Table 1.

TABLE 1

| Cases | Input voltages (VI1, VI2, VI3, VI4) | Output signal DAC0 |
|---|---|---|
| 1 | V1, V1, V1, V1 | V1 |
| 2 | V1, V1, V1, V2 | (3V1 + V2)/4 |
| 3 | V1, V1, V2, V2 | (2V1 + 2V2)/4 |
| 4 | V1, V2, V2, V2 | (V1 + 3V2)/4 |
| 5 | V2, V2, V2, V2 | V2 |

As is shown in Equations 1 and 2 and Table 1, the output signal DAC0 of the OP AMP 251 may be the result of interpolation between the first selection voltage V1 and the second selection voltage V2.

As described above, the output signal DAC0 of the OP AMP 251 may be irrelevant to the reference voltage (e.g., the first reference voltage VMIN) and may be determined by the selection voltage V1 and V2. Accordingly, the change (e.g., an interchannel offset) of the reference voltage (e.g., the first reference voltage VMIN) need not influence the output signal DAC0 of the OP AMP 251. Because an interpolation value between the selection voltages V1 and V2 is reflected to the output signal DAC0 of the OP AMP 251 as is without being inverted, the selection circuit 230 may be more easily implemented.

Figure 5:
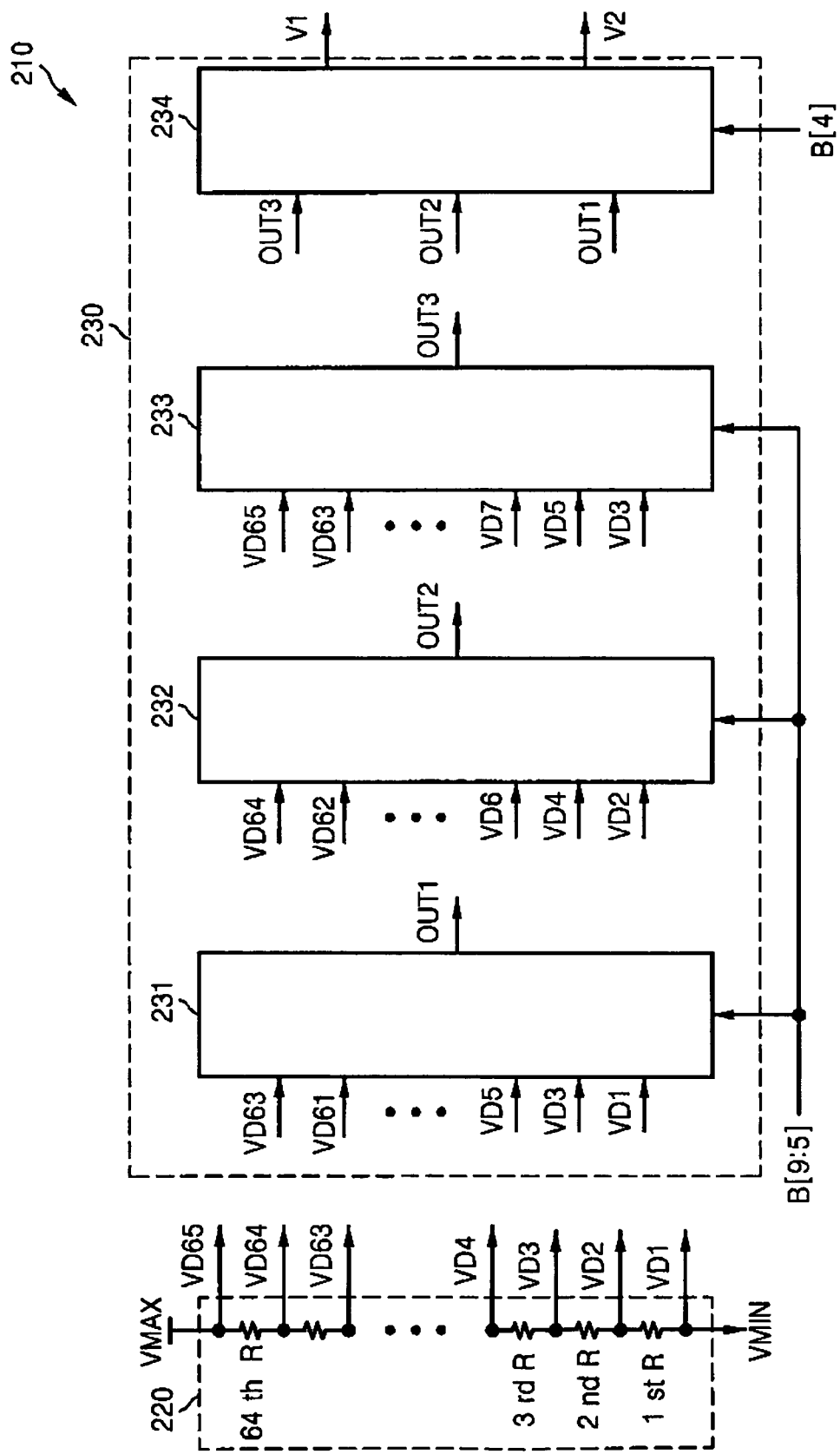
FIG. 5 is a block diagram of a signal conversion block illustrated in FIG. 2.

FIG. 5 is a block diagram of the signal conversion block 210 illustrated in FIG. 2. The signal conversion block 210 in FIG. 5 corresponds to a case where the number "n" of the bits in the digital signal DATA is 10. However, example embodiments are not limited thereto, and the number 'n' of the bits of in digital signal DATA may be a number other than 10, and the signal conversion block 210 may be configured to correspond accordingly.

Referring to FIG. 5, the voltage divider 220 may include a resistor array including $2^m$ resistors 1st R through 64th R (where "m" is 6 and $2^m=64$) connected in series and/or generate 65-level divided voltages VD1 through VD65.

The selection circuit 230 may include first through third decoders 231, 232, and 233 and/or a selector 234. The first decoder 231 may receive a first group of divided voltages VD1, VD3, VD5 . . . , VD61, and VD63 among the divided voltages VD1 through VD65, select one from the first group divided voltages VD1 through VD63 in response to a first signal B[9:5] in the first digital signal DAT1, and output the selected divided voltage as a first decoder output signal OUT1. According to an example embodiment, the digital signal DATA including the first digital signal DAT1 may be a 10-bit signal and is expressed as B[9:0]. The second decoder 232 may receive a second group of divided voltages VD2, VD4, VD6, . . . , VD62, and VD64 among the divided voltages VD1 through VD65, select one from the second group divided voltages VD2 through VD64 in response to the first signal B[9:5], and output the selected divided voltage as a second decoder output signal OUT2. The third decoder 233 may receive a third group of divided voltages VD3, VD5, ..., VD63, and VD65 among the divided voltages VD1 through VD65, select one from the third group divided voltages VD3 through VD65 in response to the first signal B[9:5], and output the selected divided voltage as a third decoder output signal OUT3. The selector 234 may select two signals from the first through third decoder output signals OUT1, OUT2, and OUT3 in response to a second signal B[4] and output the selected two signals as the first and second selection voltages V1 and V2. The second signal B[4] is the least significant bit (LSB) signal in the first digital signal DAT1 and the first signal B[9:5] is the rest of the first digital signal DAT1 excluding the second signal B[4].

Figure 6:
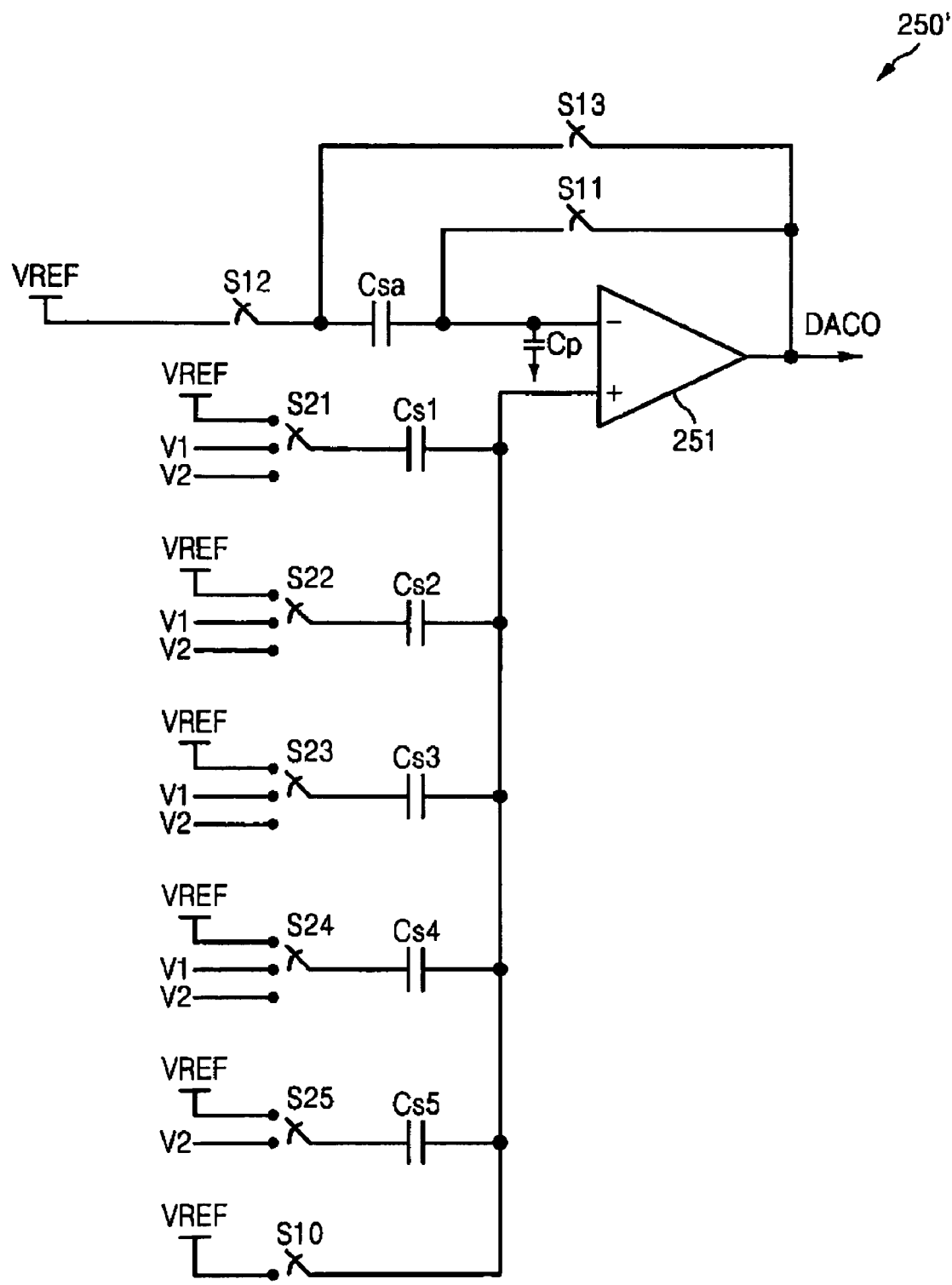
FIG. 6 is a block diagram of an amplifier according to an example embodiment.

FIG. 6 is a block diagram of an amplifier 250' according to an example embodiment. Referring to FIG. 6, the amplifier 250' may include 5 second group capacitors Cs1 through Cs5. The amplifier 250' is somewhat similar to the amplifier 250 illustrated in FIG. 2, and therefore, redundant descriptions will be omitted.

For clarity of the description, if the 5 second group capacitors Cs1 through Cs5 are referred to as first through fifth interpolation capacitors Cs1 through Cs5, the amplifier 250' may further include the fifth interpolation capacitor Cs5 and an eighth switch which selectively transmits the reference voltage VREF or the second selection voltage V2 to the fifth interpolation capacitor Cs5 in response to a signal S25, compared to the amplifier 250 illustrated in FIG. 2.

Accordingly, the second group switching signals S21, S22, S23, and S24 may be generated based on the second digital signal DAT2 (e.g., the 4 lower bits B[3:0] in the digital signal DATA). For example, the second group switching signal S24 may be generated based on the LSB B[0] in the digital signal DATA. If the LSB B[0] is at a first level (e.g., a "high level"), the first selection voltage V1 may be transmitted to the fourth interpolation capacitor Cs4 and if the LSB B[0] is at a second level (e.g., a "low level"), the second selection voltage V2 may be transmitted to the fourth interpolation capacitor Cs4. Similarly, the second group switching signal S23 may be generated based on a second LSB B[1] in the digital signal DATA and the first or second selection voltage V1 or V2 may be selectively transmitted to the third interpolation capacitor Cs3. Similarly, the second group switching signals S22 and S21 may be generated based on the third and fourth LSBs B[2] and B[3] in the digital signal DATA and the first or second selection voltage V1 or V2 may be selectively transmitted to the second and first interpolation capacitors Cs2 and Cs1. The eighth switch operating in response to the signal S25 may transmit the reference voltage VREF to the fifth interpolation capacitor Cs5 during the first period and/or transmit the second selection voltage V2 to the fifth interpolation capacitor Cs5 during the second period.

If the first through fifth interpolation capacitors Cs1 through Cs5 have 8/16, 4/16, 2/16, 1/16, and 1/16 capacitances, respectively, of a capacitance C of the first capacitor Csa, the output signal DACO may have one value among values resulting from dividing a range between the first selection voltage V1 and the second selection voltage V2 into 16 segments. The output signal DACO may be obtained by Equation (3):

$$Vx = V2 + \left(\sum_{k=1}^{N} B[k]2^{k-N-1}\right) \times dV, \quad (3)$$

where $dV=V-V2$, $B[k]$ is a bit in the second digital signal DAT2, and N is the number of bits in the second digital signal DAT2, i.e., n−m (e.g., 4 in the above noted example case). Accordingly, if the bit B[4] is "1" and the bits B[3] through B[1] are "0", the output signal DACO is expressed by $Vx=V1+\frac{1}{2}Vd$. For example, the output signal DACO is a voltage corresponding to ½ between the first selection voltage V1 and the second selection voltage V2.

According to example embodiments illustrated in FIGS. 5 and 6, if an n-bit (e.g., 10-bit) digital signal is converted into an analog signal, a plurality of divided voltages may be generated using a resistor array including $2^m$ resistors (where m<n and, for example, m=6) instead of $2^n$ resistors and a range between voltages selected from the plurality of divided voltages may be divided into $2^{n-m}$ levels, e.g., interpolation may be performed between the selected voltages, so that the n-bit digital signal may be converted into one among $2^n$-level analog voltages. Accordingly, a DAC according to example embodiments may use fewer resistors than a conventional DAC using $2^n$ resistors for an n-bit digital signal and/or use fewer capacitors and switch elements. Accordingly, a DAC according to example embodiments may be implemented with less complication, thereby occupying a smaller area and/or having a smaller size.

According to example embodiments, the resistance value of each of the resistors 1st R through $2^m$th R included in the voltage divider 220 may be determined by a desired, or alternatively, a predetermined, gamma curve. The interpolation between two voltages selected from the divided voltages may be performed linearly or nonlinearly according to a number of second capacitors and the capacitance thereof. Accordingly, nonlinear output characteristics approximating the gamma curve of a liquid crystal display (LCD) panel may be obtained by properly setting the resistance values of the resistors $1^{st}$ R through $2^m$th R, the number of second capacitors, and/or the capacitance thereof.

Figure 7:
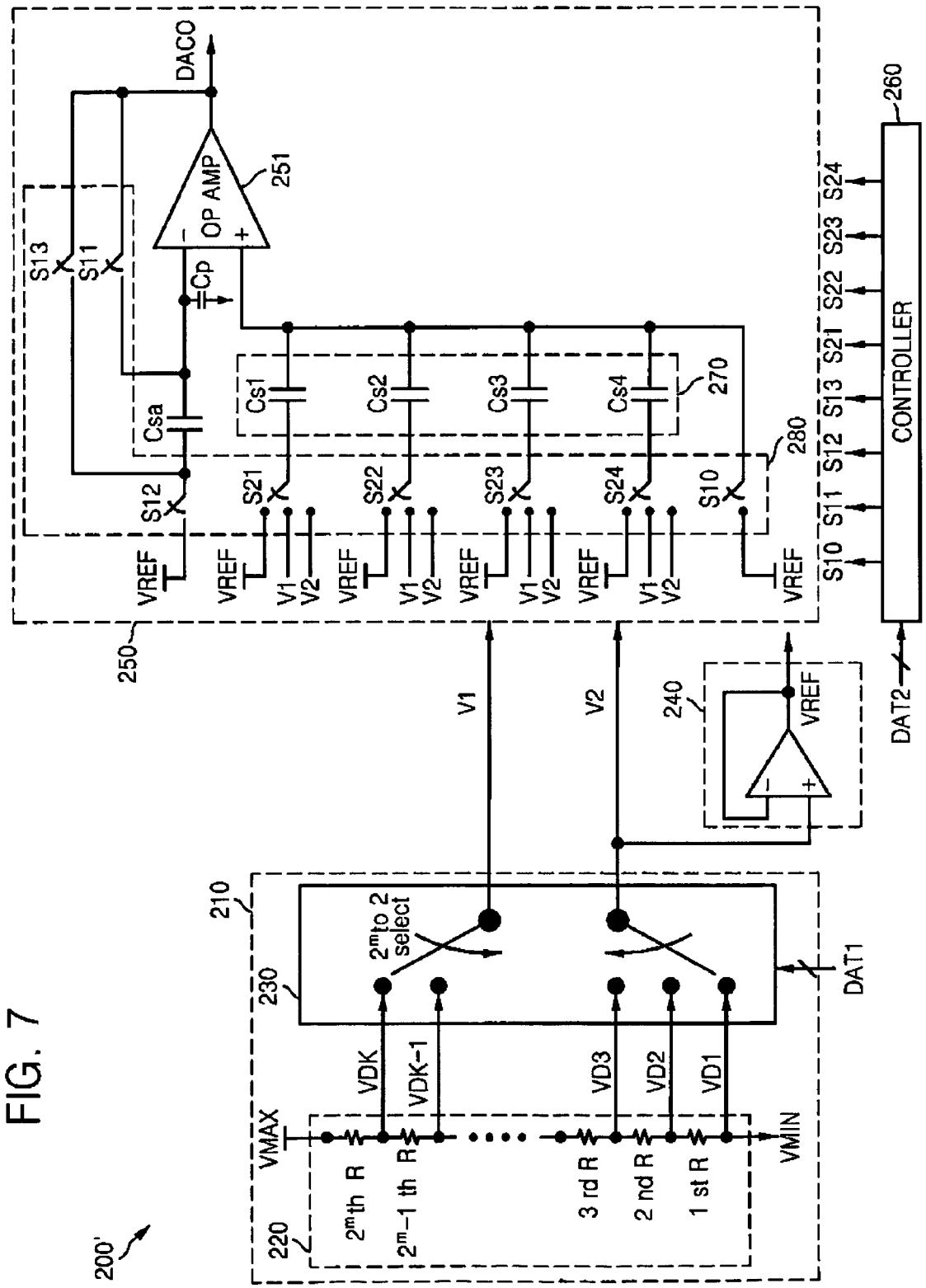
FIG. 7 illustrates a DAC according to another example embodiment.

FIG. 7 illustrates a DAC 200' according to another example embodiment. The DAC 200' may be similar to the DAC 200 illustrated in FIG. 2, but the DAC 200' may further include a buffer 240 as compared to the DAC 200 illustrated in FIG. 2. The functions and operations of the other elements in the DAC 200' are the same as the elements in the DAC 200, and therefore, descriptions thereof will be omitted.

The buffer 240 may receive and buffer one of the selection voltages V1 and V2 and output a buffered voltage as the reference voltage VREF. In the DAC 200 illustrated in FIG. 2, the reference voltage VREF is set to a desired, or alternatively, a predetermined value (e.g., the first reference voltage VMIN) regardless of the voltage of the output signal DACO. However, in the DAC 200' illustrated in FIG. 7, the reference voltage VREF may vary with a previous output signal DACO. For example, the reference voltage VREF may be set to one of the selection voltages V1 and V2 from which the previous output signal DACO is generated. According to an example embodiment illustrated in FIG. 7, the buffer 240 may buffer and output the second selection voltage V2 as the reference voltage VREF. However, in another example embodiment, the buffer 240 may buffer and output the first selection voltage V1 as the reference voltage VREF. The buffer 240 may be an analog amplifier, which has a unit gain (e.g., gain=1), having an output terminal connected with an inverting input terminal.

Figure 8:
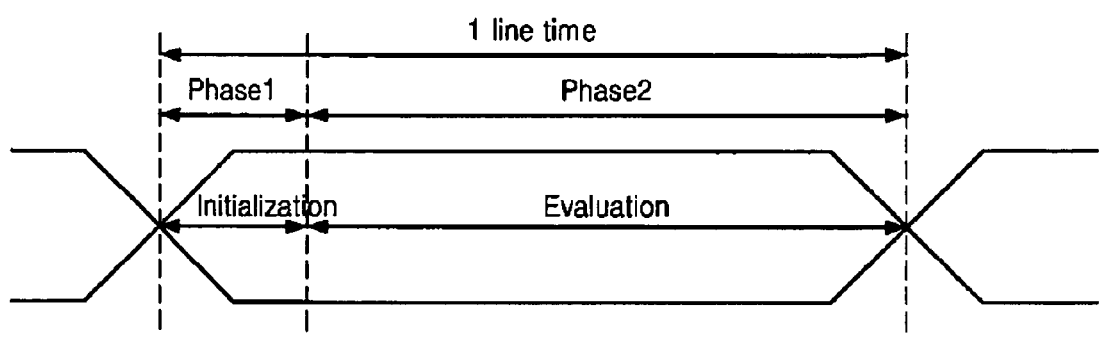
FIG. 8 is an example timing chart illustrating an operation of an amplifier according to an example embodiment.

FIG. 8 is an example timing chart illustrating an operation of the amplifier 250 included in the DAC 200 or 200' according to example embodiments. Referring to FIG. 8, 1 line time of the amplifier 250 may include the first period Phase1 and the second period Phase2. During the first period Phase1, the capacitors Csa and Cs1 through Cs4 may be initialized to the reference voltage VREF so that the output signal DACO is set to the reference voltage VREF. During the second period Phase2, the output signal DACO is driven to a gray scale voltage corresponding to a digital code DAT.

In order to consecutively generate output signals line by line, the amplifier 250 may need to initialize the capacitors Csa and Cs1 through Cs4 to the reference voltage VREF after generating an output signal DACO(T−1) corresponding to a previous digital code and before generating an output signal DACO(T) corresponding to a current digital code. In order to satisfactorily drive the output signal DACO for the 1 line time, time for the initialization, during which the output of the amplifier 250 is changed from the previous output signal DACO(T−1) to the reference voltage VREF, may be reduced.

Figure 9:
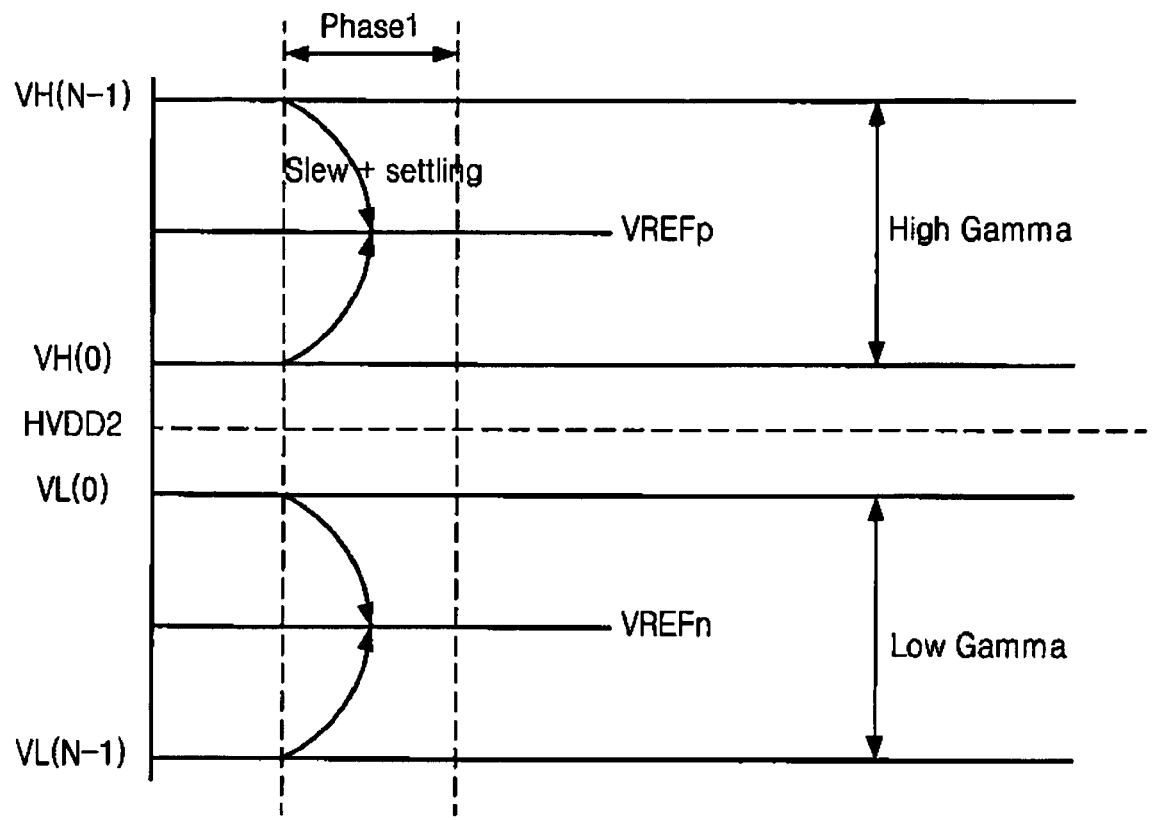
FIG. 9 is an example timing chart illustrating an initialization of an amplifier included in the DAC illustrated in FIG. 2.

FIG. 9 is an example timing chart illustrating an initialization of the amplifier 250 included in the DAC 200 illustrated in FIG. 2. A worst case scenario may be if a difference between the voltage of the previous output signal DACO(T−1) of the amplifier 250 and the reference voltage VREF has a maximum value. For example, if the amplifier 250 outputs higher gamma ranging from a first high gray scale voltage VH(0) to an (N−1)-th high gray scale voltage VH(N−1) (where N is $2^n$), the reference voltage VREF is set to a medium voltage VREFp between the first high gray scale voltage VH(0) and the (N−1)-th high gray scale voltage VH(N−1), and if the amplifier 250 outputs lower gamma ranging from a first low gray scale voltage VL(0) to an (N−1)-th low gray scale voltage VL(N−1), the reference voltage VREF is set to a medium voltage VREFn between the first low gray scale voltage VL(0) and the (N−1)-th low gray scale voltage VL(N−1). If the amplifier 250 outputs the higher gamma, the first high gray scale voltage VH(0) and the (N−1)-th high gray scale voltage VH(N−1) may correspond to the first reference voltage VMIN and the second reference voltage VMAX, respectively. If the amplifier 250 outputs the lower gamma, the first low gray scale voltage VL(0) and the (N−1)-th low gray scale voltage VL(N−1) may correspond to the first reference voltage VMIN and the second reference voltage VMAX, respectively.

In the worst case scenario described above, even if the reference voltage VREF is set to the medium VREFp or VREFn of a gamma curve, the voltage of the output signal needs to be changed as much as a voltage corresponding to ½ of the gamma curve. For example, if the previous output signal DACO(T−1) has the first high gray scale voltage VH(0) or the (N−1)-th high gray scale voltage VH(N−1), the output signal may need to be changed as much as a voltage corresponding to ½ of the difference between the (N−1)-th high gray scale voltage VH(N−1) and the first high gray scale voltage VH(0) in order to be initialized to the reference voltage VREFp. If the previous output signal DACO(T−1) has the first low gray scale voltage VL(0) or the (N−1)-th low gray scale voltage VL(N−1), the output signal may need to be changed as much as a voltage corresponding to ½ of the difference between the (N−1)-th low gray scale voltage VL(N−1) and the first low gray scale voltage VL(0) in order to be initialized to the reference voltage VREFn. Consequently, the amplifier 250 may perform slew and settling with respect to half the voltage of the entire gamma voltage, which may increase the initialization time.

Alternatively, the amplifier 250 included in the DAC 200' illustrated in FIG. 7 may set an initializing voltage for the current output signal DACO(T) using the voltage of the previous output signal DACO(T−1). For example, one of the selection voltages V1 and V2 used to calculate the previous output signal DACO(T−1) may be set as the initializing voltage, e.g., the reference voltage VREF for the current output signal DACO(T). Accordingly, the amplifier 250 included in the DAC 200' need not perform slew, but may perform only settling, thereby decreasing the initializing time and power consumption compared to the amplifier 250 included in the DAC 200.

Figure 10:
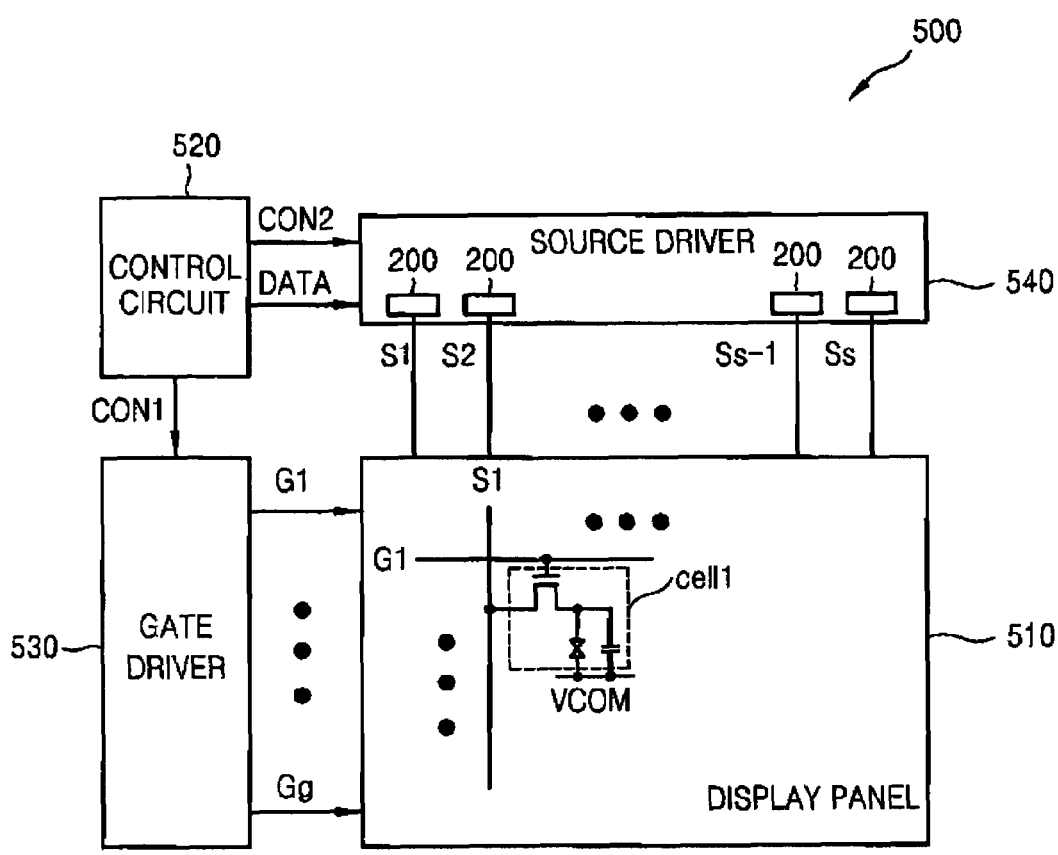
FIG. 10 is a block diagram of a display device including a source driver including the DAC illustrated in FIG. 2.

FIG. 10 is a block diagram of a display device including a source driver 540 including the DAC 200 illustrated in FIG. 2. Referring to FIG. 10, a flat display device 500, (e.g., a thin film transistor LCD (TFT-LCD), a plasma display panel (PDP), or an organic light-emitting diode (OLED)), may include a display panel 510, a control circuit 520, a gate driver 530, and/or the source driver 540.

The display panel 510 may include a plurality of data lines S1 through Ss (where "s" is a natural number), a plurality of gate lines G1 through Gg (where "g" is a natural number and g=s or g≠s), and/or a plurality of cells including a unit cell cell1. Each cell may be connected between a corresponding one among the data lines S1 through Ss and a corresponding one among the gate lines G1 through Gg.

The control circuit 520 may generate a plurality of control signals including a first control signal CON1 and a second control signal CON2. For example, the control circuit 520 may generate the first control signal CON1, the second control signal CON2, and/or digital data DATA based on a horizontal synchronization signal and/or a vertical synchronization signal.

The gate driver 530 may sequentially drive the gate lines G1 through Gg in response to the first control signal CON1. For example, the first control signal CON1 may be a signal instructing to start scanning the gate lines G1 through Gs.

The source driver 540 may include a plurality of DACs 200 according to an example embodiment. It is also apparent that the source driver 540 may include a plurality of DACs 200' according to another example embodiment. Each of the DACs 200 may be connected with a corresponding data line among the data lines S1 through Ss. For example, the output signal DACO of the DAC 200 may be provided to the data line S1. A driver that includes the DAC 200 and drives a single data line is referred to as a channel driver and the single data line is referred to as a channel.

According to example embodiments, even if a reference voltage (e.g., the first reference voltage VMIN) used in the DAC 200 is different between channel drivers, the output signal DACO of the DAC 200 need not be influenced by the reference voltage, and therefore, an offset between channel drivers (e.g., an offset between output signals of channels) may be reduced.

The source driver 540 may drive the source lines S1 through Ss in response to the second control signal CON2 and the digital data DATA, which are output from the control circuit 520.

Although not shown, a source driver module according to example embodiments may include a plurality of source drivers having a same structure as the source driver 540 illustrate in FIG. 10.

A digital-to-analog conversion method according to example embodiments may be executed by a DAC according to example embodiments. In the digital-to-analog conversion method, during a first period, a reference voltage may be provided to a first capacitor connected to a first input terminal of an OP AMP and/or may be provided to a plurality of second capacitors connected to a second input terminal of the OP AMP. The first input terminal of the OP AMP may be connected to the output terminal of the OP AMP. During a second period, the first capacitor may be isolated from the reference voltage, a voltage selected from two selection voltages may be transmitted to each of the second capacitors, and/or a first terminal of the first capacitor may be connected to the output terminal of the OP AMP.

As described above, according to example embodiments, a DAC may occupy a smaller area (and/or have a smaller size) and provide nonlinear output characteristics approximating a gamma curve an LCD panel. If the DAC is used in a display device, an offset between channel drivers, e.g., an offset between output signals of channels may be reduced.

Although example embodiments have been shown and described in this specification and figures, it would be appreciated by those skilled in the art that changes may be made to the illustrated and/or described example embodiments without departing from their principles and spirit.

What is claimed is:

1. An integrated circuit comprising:
   an operational amplifier having a first input terminal, a second input terminal, and an output terminal;
   a first capacitor having a first terminal and a second terminal, the second terminal of the first capacitor connected to the first input terminal of the operational amplifier;
   a plurality of second capacitors each having a first terminal and a second terminal, the second terminal of each of the second capacitors connected to the second input terminal of the operational amplifier;
   a switching circuit comprising a plurality of switches configured to switch in response to a plurality of switching signals; and
   a selection circuit configured to select at least two selection voltages from a plurality of divided voltages in response to a first digital signal and provide the selected voltages as at least two selection voltages, the selection circuit including at least two decoders such that each of the decoders is configured to receive a portion of the plurality of divided voltages and select at least one of the at least two selection voltages,
   wherein,
   the switching circuit is configured to transmit a reference voltage to the first terminal of the first capacitor and the first terminals of the second capacitors and connect the first input terminal of the operational amplifier to the output terminal of the operational amplifier during a first period, and
   the switching circuit is configured to isolate the first terminal of the first capacitor from the reference voltage, transmit a voltage selected from the at least two selection voltages to the first terminals of the second capacitors, and connect the first terminal of the first capacitor to the output terminal of the operational amplifier during a second period.

2. The integrated circuit of the claim 1, further comprising:
   a voltage divider comprising a resistor array connected between a first node receiving a first reference voltage and a second node receiving a second reference voltage, the voltage divider configured to generate the plurality of divided voltages by dividing a range between the second reference voltage and the first reference voltage; and
   wherein the first input terminal of the operational amplifier is an inverting input terminal and the second input terminal of the operational amplifier is a non-inverting input terminal, and the first digital signal is a portion of an n-bit digital signal.

3. The integrated circuit of the claim 2, wherein
   the at least two selection voltages comprise a first selection voltage and a second selection voltage lower than the first selection voltage, and
   the switching circuit comprises
   a first switch connected between the first input terminal of the operational amplifier and the output terminal of the operational amplifier;
   a second switch configured to selectively transmit the reference voltage to the first terminal of the first capacitor;
   a third switch configured to selectively connect the first terminal of the first capacitor to the output terminal of the operational amplifier; and
   a plurality of second group switches configured to selectively transmit the reference voltage, the first selection voltage, and the second selection voltage to the plurality of the second capacitors.

4. The integrated circuit of the claim 3, wherein
   during the first period, the first and second switches are closed, the third switch is opened, and the plurality of second group switches transmit the reference voltage to the plurality of second capacitors;
   during the second period, the first and second switches are opened, the third switch is closed, and the plurality of second group switches transmit one of the first selection voltage and the second selection voltage to the plurality of second capacitors based on a second digital signal; and
   the second digital signal is the remaining portion of the n-bit digital signal excluding the first digital signal.

5. The integrated circuit of the claim 4, wherein
   each of the plurality of second group switches is configured to transmit one of the first selection voltage and the second selection voltage to a corresponding one among the plurality of second capacitors in response to a corresponding bit in the second digital signal during the second period,
   the first digital signal is comprised of upper "m" bits in the n-bit digital signal where m is less than n and m is an integer, and
   the second digital signal is comprised of lower n minus m bits in the n-bit digital signal.

6. The integrated circuit of the claim 3, wherein
   each of the at least two decoders is configured to select one from the received divided voltages in response to a first signal in the first digital signal, and
   the first and second selection voltages are selected from output signals of the at least two decoders.

7. The integrated circuit of the claim 3, wherein the selection circuit comprises:
   a first decoder configured to receive a first group of divided voltages of the divided voltages, to select one voltage from the first group of divided voltages in response to a first signal in the first digital signal, and to output the selected voltage as a first decoder output signal;
   a second decoder configured to receive a second group of divided voltages of the divided voltages, to select one voltage from the second group of divided voltages in response to the first signal, and to output the selected voltage as a second decoder output signal;
   a third decoder configured to receive a third group of divided voltages of the divided voltages, to select one voltage from the third group of divided voltages in response to the first signal, and to output the selected voltage as a third decoder output signal; and
   a selector configured to select two signals from the first through third decoder output signals in response to a second signal in the first digital signal and output the selected two signals as the first and second selection voltages, wherein the second signal is a least significant bit in the first digital signal, and wherein the first signal is the remainder of the first digital signal excluding the second signal.

8. The integrated circuit of the claim 7, wherein
the resistor array comprises $2^n$ resistors connected in series,
the divided voltages comprise $(2^m+1)$-level voltages,
the first group of divided voltages comprise odd numbered voltages excluding a highest voltage among the $(2^m+1)$-level voltages,
the second group of divided voltages comprise even numbered voltages among the $(2^m+1)$-level voltages,
the third group of divided voltages comprise the odd numbered voltages excluding a lowest voltage among the $(2^m+1)$-level voltages, and
the selector is configured to select two signals from the first through third decoder output signals in response to the second signal and output the selected two signals as the first and second selection voltages.

9. The integrated circuit of the claim 8, wherein the plurality of second capacitors comprise:
a first interpolation capacitor configured to have a capacitance corresponding to $8/16$ of a capacitance of the first capacitor, the first interpolation capacitor configured to selectively receive one of the first selection voltage and the second selection voltage based on a fourth bit from a least significant bit in the n-bit digital signal during the second period, the least significant bit being a first bit in the n-bit digital signal;
a second interpolation capacitor configured to have a capacitance corresponding to $4/16$ of the capacitance of the first capacitor, the second interpolation capacitor configured to selectively receive one of the first selection voltage and the second selection voltage based on a third bit from the least significant bit in the n-bit digital signal during the second period;
a third interpolation capacitor configured to have a capacitance corresponding to $2/16$ of the capacitance of the first capacitor, the third interpolation capacitor configured to selectively receive one of the first selection voltage and the second selection voltage based on a second bit from the least significant bit in the n-bit digital signal during the second period;
a fourth interpolation capacitor configured to have a capacitance corresponding to $1/16$ of the capacitance of the first capacitor, the fourth interpolation capacitor configured to selectively receive one of the first selection voltage and the second selection voltage based on the least significant bit in the n-bit digital signal during the second period; and
a fifth interpolation capacitor configured to have a capacitance corresponding to $1/16$ of the capacitance of the first capacitor, the fifth interpolation capacitor configured to receive the first selection voltage during the second period.

10. The integrated circuit of the claim 2, wherein the switching circuit further comprises an initializing switch configured to transmit the reference voltage to the second input terminal of the operational amplifier during the first period.

11. The integrated circuit of the claim 2, wherein the reference voltage is one selected from the group including the first reference voltage, the second reference voltage, and a medium voltage between the first reference voltage and the second reference voltage.

12. The integrated circuit of the claim 2, wherein the reference voltage is one of the at least two selection voltages.

13. The integrated circuit of the claim 12, further comprising:
a buffer configured to buffer a voltage selected from among the at least two selection voltages and output a buffered voltage as the reference voltage.

14. The integrated circuit of the claim 1, further comprising:
a controller configured to output the plurality of switching signals.

15. The integrated circuit of the claim 1, wherein the integrated circuit is a digital-to-analog converter.

16. A source driver for a display device, the source driver comprising the integrated circuit of claim 1.

17. A display device comprising:
a plurality of data lines;
a plurality of gate lines;
a plurality of cells, each cell connected between a corresponding one of the plurality of data lines and a corresponding one of the plurality of gate lines; and
the source driver of claim 16,
wherein a voltage of the output terminal of the operational amplifier included in the integrated circuit is provided to a corresponding one of the plurality of data lines.

18. A digital-to-analog conversion method comprising:
during a first period, providing a reference voltage to a first capacitor connected to a first input terminal of an operational amplifier and a plurality of second capacitors connected to a second input terminal of the operational amplifier and connecting the first input terminal of the operational amplifier to an output terminal of the operational amplifier;
selecting at least two selection voltages from the plurality of divided voltages in response to and based one the first digital signal and providing the selected voltages as the at least two selection voltages, the selection being performed by at least two decoders such that each of the decoders is configured to receive a portion of the plurality of divided voltages and select at least one of the at least two selection voltages; and
during a second period, isolating the first capacitor from the reference voltage, transmitting a voltage selected from the at least two selection voltages to each of the plurality of second capacitors, and connecting a first terminal of the first capacitor to the output terminal of the operational amplifier,
wherein the voltage transmitted to each of the plurality of second capacitors during the second period is determined based on a second digital signal.

19. The digital-to-analog conversion method of claim 18, wherein
the first digital signal is comprised of at least one upper bit of a digital signal, and the second digital signal is comprised of at least one lower bit of the digital signal.

20. The digital-to-analog conversion method of claim 18, further comprising:
dividing a range between a first reference voltage and a second reference voltage and generating a plurality of divided voltages.

21. The integrated circuit of the claim 18, further comprising:
buffering one voltage of the at least two selection voltages and providing a buffered voltage as the reference voltage.

22. A method, comprising:
applying charges based on a reference voltage to first and second inputs of an operational amplifier during a first period;

applying a charge based on a feedback voltage to the first input of the operational amplifier during a second period;
selecting at least two selection voltages, the selection being performed by at least two decoders such that each of the decoders is configured to receive a portion of a plurality of divided voltages and select at least one of the at least two selection voltages; and
applying a charge based on a voltage selected from the at least two selection voltages to the second input of the operational amplifier during the second period.

23. A integrated circuit, comprising:
a first circuit architecture configured to apply a charge based on a reference voltage to a first input of an operational amplifier during a first period and apply a charge based on a feedback voltage to the first input of the operational amplifier during a second period and
a second circuit architecture configured to apply a charge based on the reference voltage to a second input of the operational amplifier during the first period and apply a charge based on a voltage selected from at least two selection voltages to the second input of the operational amplifier during a second period, the at least two selection voltages being selected by at least two decoders configured to receive a portion of a plurality of divided voltages.

* * * * *